(12) United States Patent
Ross et al.

(10) Patent No.: US 11,165,428 B1
(45) Date of Patent: Nov. 2, 2021

(54) CIRCUITS AND METHODS FOR UPDATING LOOKUP TABLES

(71) Applicant: Groq, Inc., Mountain View, CA (US)

(72) Inventors: Jonathan Ross, Mountain View, CA (US); Dinesh Maheshwari, Mountain View, CA (US)

(73) Assignee: Groq, Inc., Mountain View, CA (US)

( * ) Notice: Subject to any disclaimer, the term of this patent is extended or adjusted under 35 U.S.C. 154(b) by 0 days.

(21) Appl. No.: 16/932,632

(22) Filed: Jul. 17, 2020

Related U.S. Application Data

(60) Provisional application No. 62/875,929, filed on Jul. 18, 2019.

(51) Int. Cl.
| | | |
|---|---|---|
| H03K 19/173 | (2006.01) | |
| H03K 19/17728 | (2020.01) | |
| H03K 19/21 | (2006.01) | |
| G06F 9/38 | (2018.01) | |
| H03K 19/017 | (2006.01) | |

(52) U.S. Cl.
CPC ..... *H03K 19/17728* (2013.01); *G06F 9/3887* (2013.01); *H03K 19/01728* (2013.01); *H03K 19/1737* (2013.01); *H03K 19/21* (2013.01)

(58) Field of Classification Search
CPC ............ G06F 9/3887; H03K 19/01728; H03K 19/1737; H03K 19/17728; H03K 19/21
See application file for complete search history.

(56) References Cited

U.S. PATENT DOCUMENTS

| | | | | |
|---|---|---|---|---|
| 5,889,413 A | * | 3/1999 | Bauer | H03K 19/17736 326/40 |
| 6,181,164 B1 | * | 1/2001 | Miller | H03K 19/1736 326/40 |
| 10,320,390 B1 | | 6/2019 | Ross | |
| 2002/0060796 A1 | * | 5/2002 | Kanno | H04N 1/6075 358/1.9 |
| 2012/0275545 A1 | * | 11/2012 | Utsunomiya | H04L 27/368 375/297 |
| 2018/0191537 A1 | * | 7/2018 | Xiong | H04B 1/005 |
| 2019/0206454 A1 | * | 7/2019 | Ross | G11C 7/22 |

FOREIGN PATENT DOCUMENTS

EP          0940012 B1          4/2002

* cited by examiner

*Primary Examiner* — Kurtis R Bahr
(74) *Attorney, Agent, or Firm* — Fenwick & West LLP

(57) ABSTRACT

The present disclosure provides circuits and methods that can be used to update configurations. An example circuit can include a plurality hLUTs and a plurality of registers configured to propagate a set of data or a portion thereof to the plurality of hLUTs. An hLUT of the plurality of hLUTs can have a transformation unit comprising transformation circuitry configured to (i) receive the set of data or the portion thereof from a register of the plurality of registers and (ii) transform the set of data or the portion thereof into configurations for the hLUT.

22 Claims, 10 Drawing Sheets

| In | Out |
|---|---|
| 0x0000000 | 0x0000001 |
| ... | ... |
| 0x0000010 | 0x0000011 |
| 0x0000011 | ... |
| 0x0000100 | 0x0000101 |
| ... | 0x0000110 |
| | |
| | |
| | |
| | |
| | |
| 0x1111111 | 0x0000000 |

| In | Out |
|---|---|
| 0x0000000 | 0x0000001 |
| 0x0000001 | 0x0000010 |
| 0x0000010 | 0x0000011 |
| 0x0000011 | 0x0000100 |
| 0x0000100 | 0x0000101 |
| 0x0000101 | 0x0000110 |
| | |
| | |
| | |
| | |
| | |
| | |
| 0x1111111 | 0x0000000 |

FIG. 10

CIRCUITS AND METHODS FOR UPDATING LOOKUP TABLES

CROSS-REFERENCE TO RELATED APPLICATIONS

This application claims a benefit and priority under 35 U.S.C. § 119(e) to U.S. Provisional Patent Application No. 62/875,929, filed Jul. 18, 2019, which is incorporated herein by reference in its entirety.

BACKGROUND

Lookup tables (LUTs) are memory structures that store pre-computed results of operations. For example, LUTs store pre-computed results of operations for a range of possible input values. In some cases, retrieving a pre-computed result from an LUT by performing an indexing operation is faster than computing the result from the input value in real time using an arithmetic logic unit (ALU). However, storing results for a large range of input values can require a significant amount of memory, and updating those results (e.g., to adjust or change the operation that the LUT performs) can require propagating a large amount of data from one location within a processor to another. This propagation is time and energy-intensive.

SUMMARY

The present disclosure provides a circuit used to update the pre-computed results stored in an augmented multi-port lookup table (a HyperLUT or hLUT) (also referred to as "hLUT configurations" or "configurations" in this disclosure). The hLUT, being an augmented LUT, is also a memory structure. In some embodiments, the hLUT uses multiple read ports in a single structure to improve the efficiency of single-instruction multiple data (SIMD) operations. Such an approach requires less data than would using an equivalent number of single-port LUTs to achieve the same number of read ports. The circuit has a plurality of registers configured to propagate data, a plurality of transformation units configured to transform the data to LUT configurations, and a plurality of hLUTs. In some cases, it may be desirable to minimize the amount of data propagated by the registers. Minimizing the amount of data propagated by the registers can reduce energy consumption, processing time, and register size. The circuit disclosed in the present disclosure can minimize the amount of data propagated by the registers by relying on the transformation units to transform the data into LUT configurations that fit into the LUTs. Specifically, the registers propagate raw data or partial, incomplete, or compressed LUT configurations instead of the final LUT configurations. The raw data or partial, incomplete, or compressed LUT configurations use less memory than the final LUT configurations and are less time and energy-intensive to propagate to the LUTs. The transformation units, which in some embodiments are in close physical proximity to the LUTs, transform the raw data or the partial, incomplete, or compressed LUT configurations into final LUT configurations stored in the LUTs.

One aspect of the present disclosure provides a circuit used to update a plurality of hLUTs is disclosed. The circuit comprises a plurality of hLUTs and a plurality of registers configured to propagate a set of data or a portion thereof to the plurality of hLUTs. The circuit also comprises, for a hLUT of the plurality of hLUTs, a transformation unit comprising transformation circuitry. The transformation circuitry is configured to (i) receive the set of data or the portion thereof from a register of the plurality of registers, (ii) transform the set of data or the portion thereof into configurations for the hLUT, and (iii) write the configuration in the hLUT for access upon a query of the hLUT.

In some embodiments, the hLUT comprises (i) a first memory sub-structure (e.g., an upper LUT) configured to store a first subset of data of the set of data, (ii) a second memory sub-structure (e.g., a lower LUT) configured to store a second subset of data of the set of data, and (iii) a third memory sub-structure (e.g., a difference LUT) configured to store difference data defining a difference between corresponding elements of the first subset of data and the second subset of data.

In some embodiments, the hLUT is configured to implement n-way single instruction multiple data (SIMD) logic where n is an integer greater than 1.

In some embodiments, the circuit further comprises write circuitry configured to write the configurations to the hLUT.

In some embodiments, the plurality of hLUTs are configured to implement a single instruction multiple data (SIMD) application.

In some embodiments, the transformation circuitry comprises difference data generation circuitry configured to generate the difference data using at least the set of data or the portion thereof from the register.

In some embodiments, the write circuitry is configured to write (i) the set of data or the portion thereof from the register to the first memory sub-structure (e.g., an upper LUT) and/or the second memory sub-structure (e.g., a lower LUT) and (ii) the difference data from the difference data generation circuitry to the third memory sub-structure (e.g., a difference LUT).

In some embodiments, the difference data generation circuitry comprises a circuit configured to implement a reversible function. The reversible function can be an exclusive or (XOR) function.

In some embodiments, the transformation circuitry is configured to transform the set of data or the portion thereof into configurations at least in part by applying an identity transformation to the set of data or the portion thereof.

In some embodiments, the transformation circuitry is configured to implement an enable function that determines whether the set of data or the portion thereof is written to said hLUT.

In some embodiments, the transformation circuitry comprises an XOR gate configured to apply an XOR function to entries in a first subset of the set of data and corresponding entries in the second subset of the set of data.

In some embodiments, the set of data or the portion thereof comprises compressed configurations, and wherein the transformation circuitry is configured to transform the set of data or the portion thereof into configurations at least in part by decompressing the compressed configurations.

In some embodiments, a quantity of the plurality of hLUTs and a quantity of the plurality of registers is the same.

In some embodiments, the configurations are pre-computed outputs of a function, and the hLUT can be configured to generate an output of the function for an input. The function can be selected from the group consisting of a rectified linear unit function, a binary step function, an arc tan function, a maximum or minimum function, a square root function, an inverse square root function, addition, subtraction, multiplication, and division.

In some embodiments, the transformation circuitry comprises a multiplexer, and the multiplexer is configured to receive a different set of data from each of multiple registers in the plurality of registers and select one or more of the different sets of data to write to the hLUT.

In some embodiments, the plurality of registers is configured to propagate the set of data or the portion thereof to successive hLUTs in the plurality of hLUTs on successive clock cycles.

In some embodiments, a quantity of the plurality of registers is less than a quantity of the plurality of hLUTs, and two or more hLUTs of the plurality of hLUTs can share a single register of the plurality of registers.

In some embodiments, the plurality of registers are configured to propagate the set of data or the portion thereof to a hLUT in the plurality of hLUTs over multiple clock cycles.

In some embodiments, the circuit further comprises an artificial intelligence (AI) processor configured to selectively access results stored in the hLUT or results calculated by a vector-matrix calculation.

Another aspect of the present disclosure provides a method for updating configurations of a hLUT. The method can comprise, receiving, from a register of a plurality of registers, a set of data or a portion thereof propagated by at least a subset of the plurality of registers, transforming the set of data or the portion thereof into configurations for a hLUT of a plurality of hLUTs, including configuring the set of data or the portion thereof to fit into the hLUT; and writing the configurations to the hLUT.

In some embodiments, the configurations comprise more data than the set of data or the portion thereof.

In some embodiments, transforming the set of data or the portion thereof into configurations comprises applying a reversible function to the set of data or the portion thereof. In some embodiments, the reversible function is an XOR function.

In an aspect, a circuit for configuring a plurality of HyperLUTs (hLUTs) is disclosed. The circuit comprises a plurality of hLUTs. An hLUT of the plurality of hLUTs comprise an upper logic table, a lower logic table, and a difference logic table. It also comprises a plurality of registers configured to propagate a set of data or a portion thereof to the plurality of hLUTs, the set of data comprising one or more upper logic table values for the upper logic table and one or more lower logic table values for the lower logic table. It also comprises a transformation unit connecting at least one of the plurality of registers to one of the plurality of hLUTs, the transformation unit comprising transformation circuitry configured to (i) receive the set of data or the portion thereof from a register of the plurality of registers, (ii) calculate difference logic table values by performing one or more computations on the one or more upper logic table values and the one or more lower logic table values, and (iii) write the one or more upper table results into the upper logic table, the one or more lower table results into the lower logic table, and the difference results into the difference logic table. The upper logic table results, the lower logic table results, and the difference logic table results comprise a configuration providing the access to the results upon a query of the hLUT In some embodiments, the results eliminates repetitive calculations performed by an ALU.

Another aspect of the present disclosure provides a non-transitory computer readable medium comprising machine executable code that, upon execution by one or more computer processors, implements any of the methods above or elsewhere herein or performs the functions of the circuits above or elsewhere herein.

Another aspect of the present disclosure provides a system comprising one or more computer processors and computer memory coupled thereto. The computer memory comprises machine executable code that, upon execution by the one or more computer processors, implements any of the methods above or elsewhere herein or performs the functions of the circuits above or elsewhere herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

FIG. 9 schematically illustrates partial configuration data to be provided to an hLUT, in accordance with an embodiment.

FIG. 10 schematically illustrates a complete configuration, in accordance with an embodiment.

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Lookup tables (LUTs) are memory structures that store pre-computed results of operations. Specifically, a particular lookup table can store pre-computed results of an operation for a range of possible input values. In many cases, retrieving a pre-computed result from an LUT by performing an indexing operation is faster than computing the result from the input value in real time. However, storing results for a large range of input values can require a significant amount of memory, and updating those results (e.g., to adjust or change the operation that the LUT performs) can require propagating a large amount of data from one location within an artificial intelligence (AI) processor to another. This propagation is time and energy-intensive.

The present disclosure provides a circuit that can be used to update the pre-computed results stored in a memory structure herein referred to as a HyperLUT (hLUT). In this disclosure, the pre-computed results are also referred to as "hLUT configurations" or "configurations." An hLUT includes multiple ports for concurrent reads and is implemented using smaller memory structures contained within itself. Depending on the number of ports in the hLUT, these smaller memory structures may be LUTs (for a two-port hLUT) or hLUTs (for hLUTs with more than two ports). For a set of data, the hLUT includes an "upper LUT/hLUT" including an upper half of the values of the set of data, a "lower LUT/hLUT" including a lower half of the values of the set of data, and a "difference LUT/hLUT" for storing results of a reversible function (such as an XOR) applied to the upper and lower value halves. For a given number of ports, the hLUT does not require as many configuration data entries as would require the same number of single-port LUTs. The circuit provided in the present disclosure addresses the previously-described problems of implementing an artificial intelligence processor using single-port LUTs by propagating a smaller amount of data to an hLUT, transforming that data into final hLUT configurations using a transformation unit, and storing the final hLUT configurations in the hLUT, increasing the power and speed of the AI processor by reducing the number of computations it needs to perform.

Reference will now be made to the figures, wherein like numerals refer to like parts throughout. It will be appreciated that the figures are not necessarily drawn to scale.

Figure 1:
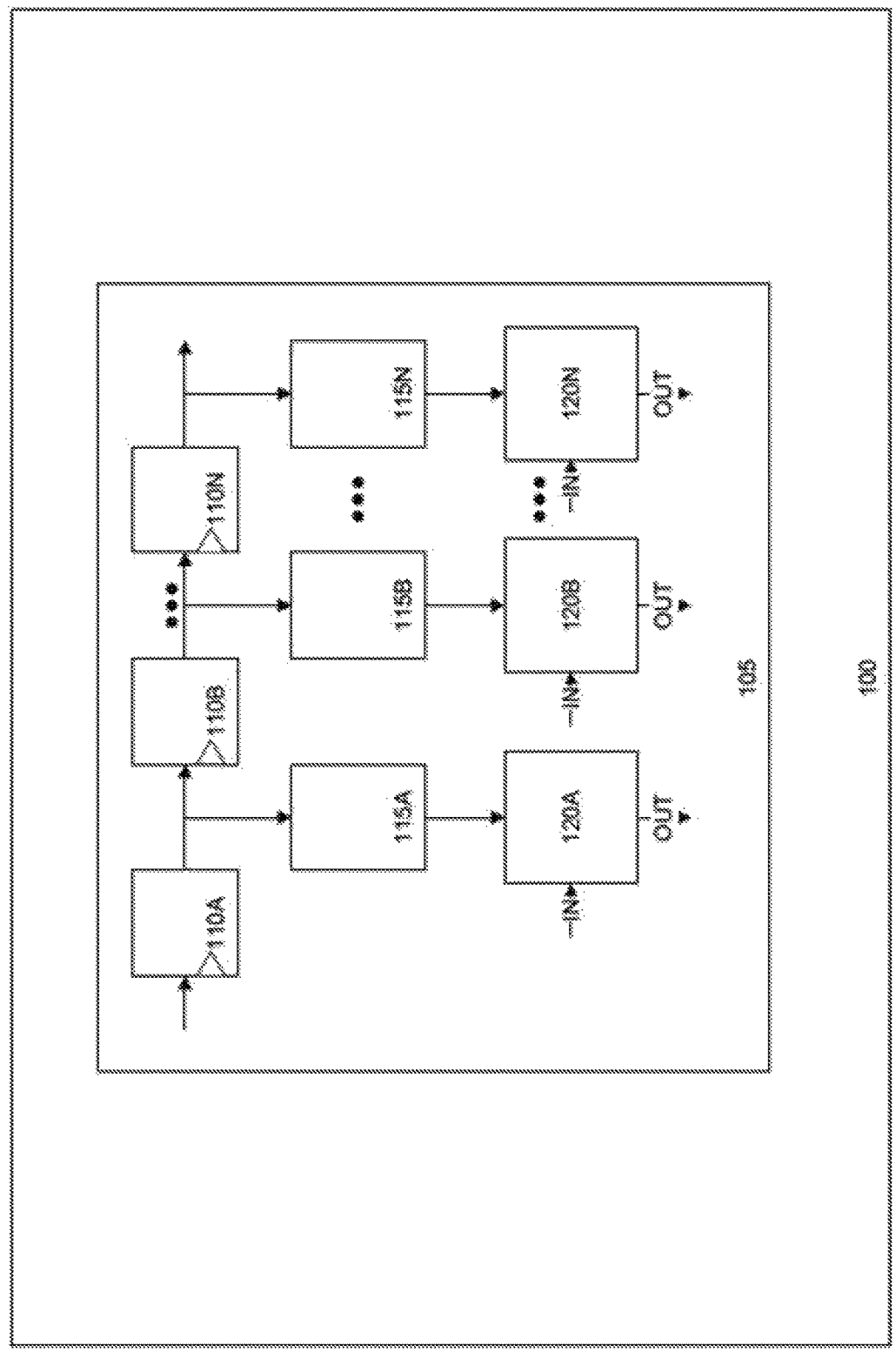
FIG. 1 schematically illustrates a circuit for updating lookup table configurations.

FIG. 1 illustrates a circuit 105 used to update hLUT configurations, according to an embodiment of the present disclosure. The circuit 105 is a component of a processor 100. In the embodiment of FIG. 1, the processor 100 is the tensor streaming processor (TSP) described in FIG. 7. The circuit 105 includes a plurality of registers 110 (e.g., registers 110A to 110N), a plurality of transformation units 115 (e.g., transformation units 115A to 115N), and a plurality of hLUTs 120 (e.g., hLUTs 120A to 120N).

In the embodiment of FIG. 1, the hLUTs 120 include a large number (e.g., millions) of memory cells configured to store data. In some embodiments, the memory cells are arranged in large rectangular arrays. In some embodiments, the memory cells are dynamic random access memory (DRAM) cells, static random access memory (SRAM) cells, flip-flops, or other types of memory cells configured for both reading and writing.

A DRAM cell stores a bit of data, e.g., a 1 or a 0, in a small capacitor that is accessible through a single transistor. When the capacitor is charged, it can represent a 1, and when the capacitor is discharged, it can represent a 0, or vice versa. A consumer component reads from the DRAM cell by activating the transistor through a "word line." The activated transistor passes charge from the capacitor to a "bit line" or from the bit line to the capacitor. A sense amplifier connected to the bit line detects and amplifies the resulting change in voltage on the bit line. The consumer component accesses the voltage on the bit line, which represents the value of the bit of data that was stored in the capacitor. A producer component writes to the DRAM cell by activating the word line of the DRAM cell and setting the value of the cell's bit-line to the appropriate value. DRAM cells generally need to be periodically refreshed in order to counteract charge leakage from their capacitors. As such, DRAM may consume more energy than SRAM.

An SRAM cell stores a bit of data in a pair of cross-coupled invertors. Two transistors—one connected to each of the cross-coupled invertors—provide access to the invertors. A consumer component reads from the SRAM cell by activating the transistors through a word-line and detecting the resulting difference in voltage on two bit lines connected to the transistors. A producer component writes to the SRAM cell by activating the word line and setting the value of the cell's bit lines to the appropriate values. Because SRAM cells have as many as six transistors, SRAM cells may be larger than DRAM cells. However, SRAM cells need not be refreshed, and reading from SRAM cells may be faster than reading from DRAM cells.

The memory cells of the hLUTs 120 store pre-computed results of various operations. Specifically, each one of the hLUTs 120 store pre-computed results of an operation for a range of possible input values.

The operations for which the hLUTs 120 store pre-computed results include mathematic functions, logic functions, cryptographic functions, or the like. The mathematic functions include arithmetic functions, linear functions, geometric functions, trigonometric functions (e.g., sine, cosine, tangent), exponential functions, differential equations, or the like. The logic functions include n-input Boolean functions. The cryptographic functions include hash functions or the like. In some cases, the hLUTs 120 store pre-computed results for functions that are commonly used in machine learning applications, e.g., the rectified linear unit (RELU) function, the binary step function, the arc tan function, or the like.

In some cases, the processor 100 is used to perform single instruction multiple data (SIMD) applications. SIMD applications are applications in which a single operation is performed on multiple sets of input data in parallel. For example, in certain machine learning applications, different activations are multiplied by the same weight value or different weighted sums are provided to the same activation function. To facilitate execution of SIMD applications, the hLUTs 120 store results of the same operation. In this way, the hLUTs 120 perform that operation on different data in parallel. In some cases, each hLUT 120 has multiple read ports. Each read port can itself receive different input data, and an hLUT 120 can perform a single operation on that data in parallel, further expanding the processor's SIMD capabilities.

In the circuit 100, the registers 110 propagate data to the hLUTs 120. In some implementations, the data are partial, incomplete, or compressed hLUT configurations. In some other implementations, the data is raw data (data that represents a set of input values for a particular operation, e.g., a range of numbers between 0 and $2\pi$ for a sine calculation) that is transformed into hLUT configurations by the transformers 115 performing an operation on the raw data. And in still other implementations, the data is the full and final hLUT configurations to be stored in the hLUTs 120. The registers 110 propagate hLUT configurations to a particular hLUT 120 in a single clock cycle or over multiple clock cycles. For example, a register 110 can be partially filled with data on each of a plurality of clock cycles until the register is completely filled. After the register is completely filled, the data can be transmitted to a transformation unit 115, which then transforms the data into an hLUT configuration and propagates the configuration to an hLUT 120.

The registers 110 are made of latches or flips-flops configured to temporarily store a single bit of data. The latches or flip-flops can be level-triggered or edge-triggered, synchronous or asynchronous, and transparent or opaque. For example, the latches or flip-flops can be set-reset (SR) NOR latches, SR NAND latches, SR AND-OR latches, gated SR latches, gated D latches, positive-edge-triggered D flip-flops, or the like.

In some implementations, the circuit 105 has one register 110 for each of the hLUTs 120. In such implementations, successive hLUTs 120 are updated on successive clock cycles as data passes from one register 110 to a subsequent register 110. In other implementations, multiple hLUTs 120 share a register 110 and are updated on a same clock cycle. This reduces (i) the number of registers in the processor 100 and (ii) the number of clock cycles it takes to update all of the hLUTs 120.

The transformation units 115 transform data from the registers 110 into the final hLUT configurations that will be stored in the hLUTs 120. A transformation unit 115 can be configured to perform one of many different transformations on the data. As described in detail above, it may be desirable to propagate partial, incomplete, or compressed hLUT configurations to the hLUTs 120 to reduce processing time, energy consumption, or register size. In such implementations, the transformation units 115 are configured to compute the missing hLUT configurations. In some embodiments, the transformation units 115 interpolate the remaining hLUT configurations or decompress compressed hLUT configurations. In some embodiments, the transformation units 115 use polynomial-based interpolation to impute missing data to form configuration data for an hLUT.

In other implementations, the transformation units 115 receive raw data representing a range of possible input values for an operation and compute hLUT configurations by performing the operation on the raw data. For example, if the desired hLUT configurations are pre-computed results of the sine function, the registers 110 propagate a range of input values between 0 and $2\pi$. The transformation units 115 is then configured to implement the sine function for those input values. In some cases, propagating input data may be less expensive than propagating hLUT configurations directly.

In still other implementations, the transformation units 115 receive complete hLUT configurations from the registers 110 and generate "difference data." The difference data allows multiple consumer components to read from a single hLUT 120 on the same clock cycle, which facilitates the execution of SIMD applications. This use of difference data will be described in more detail in reference to subsequent figures.

The transformation units 115 can be configured to perform other transformations. For example, the transformation units 115 can be configured to implement an identity transformation, compression or decompression (e.g., run-length encoding or decoding), encryption, or the like. In some embodiments, the transformation units 115 implement enable functions that determine whether data from the registers 110 is written to the hLUTs 120. The enable functions may be implemented, for example, with multiplexers.

In some embodiments, the transformation units 115 include multiplexers. The multiplexers are configured to receive data from a plurality of different registers 110 or other sources. The multiplexers can be configured to select data from one or more of those different registers 110 or other sources. In this way, the hLUTs 120 are updated with configurations from multiple different configuration streams. In some embodiments, the transformation units include arithmetic logic units (ALUs) or floating point units (FPUs) to perform calculations to transform the data into configuration data.

In addition to having circuitry implementing the functionality described above, the transformation units 115 have write circuitry configured to write transformed data to the hLUTs 120. The write circuitry can include data busses and address lines configured to write data to the appropriate memory cell of an hLUT 120.

In some embodiments, the circuit 105 enables LUT configurations to be quickly swapped during runtime.

Figure 2:
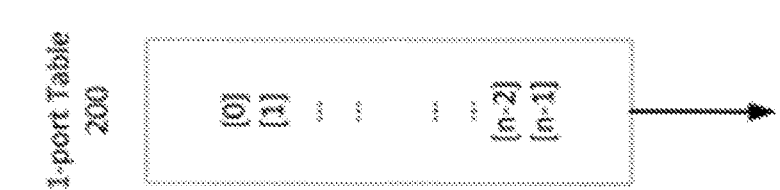
FIG. 2 schematically illustrates a lookup table with a single read port.

FIG. 2 illustrates a LUT 200 with one read port, in accordance with an embodiment. The LUT 200 stores a plurality of data entries (e.g., entries [0] through [n−1], where n is an integer greater than 1). Because the LUT 200 has only a single read port 205, only a single consumer component can read the data stored in the LUT 200 at a given time. One way to allow multiple consumer components to access the data entries stored in the LUT 200 in parallel is to duplicate the data across multiple single read port LUTs. For example, duplicating the data of the LUT 200 across a second single read port LUT may result in a combined LUT with two read ports, each of which can be independently accessed by a different consumer component providing access to any of the data entries. However, this configuration doubles the amount of memory needed to store the data because each of the entries [0] through [n−1] will be duplicated across both single port LUTs. Thus, to build a memory structure having n entries accessible over $2^{m-1}$ read ports, a total of $n*2^m$ entries need to be stored, where m comprises a positive integer value.

Figure 3:
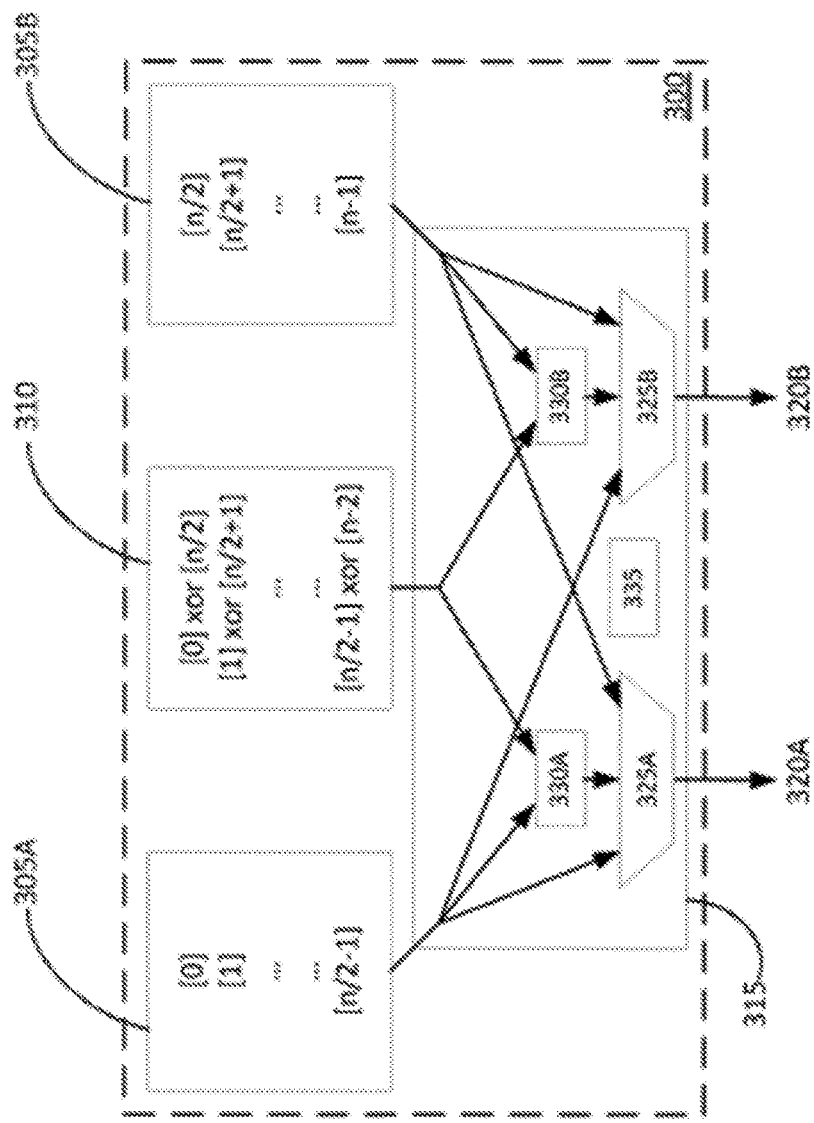
FIG. 3 schematically illustrates a lookup table with two read ports.

FIG. 3 illustrates a two-port hLUT 300, in accordance with one embodiment. The hLUTs described in FIGS. 3-10 may include, or may be similar to any of the hLUTs (memory structures) described in application Ser. No. 16/132,196 (Pub. No. US 2019/0206454 A1) titled "Data Structures with Multiple Read Ports" filed on Sep. 14, 2018. The two-port hLUT 300 enables multiple consumer components to access any of n entries of data (entries [0] through [n−1]) on the same clock cycle, facilitating the execution of SIMD applications. The two-port hLUT 300 is made of three one-port LUTs. Each of the one-port LUTs stores [n/2] entries. As such, the two-port hLUT 300 only requires storage of 50% more entries in comparison to the one-port LUT 200 while still allowing concurrent access to all n entries through either of the two read ports.

The two-port hLUT 300 includes a first one-port LUT 305A that stores a first half of the data entries [0] through [n−1] (e.g., entries [0] through [n/2−1]) and a second one-port LUT 305B that stores a second half of the entries [0] through [n−1] (e.g., entries [n/2] through [n−1]). For ease of explanation, the first half of the data entries is referred to as the "lower" half, while the second half is referred to as the "upper" half. As such, the first one-port LUT 305A is referred to as the "lower LUT," while the second one-port LUT 305B is referred to as the "upper LUT."

In addition to the lower and upper LUTs 305A and 305B, the two-port hLUT 300 includes a third one-port LUT 310 (also referred to as the "difference LUT") that stores n/2 entries. The entries in the third one-port LUT 310 indicate whether a difference exists between an entry in the lower LUT and a corresponding entry in the upper LUT. In this embodiment, the difference LUT stores an entry indicating a difference between entry [0] of the lower LUT and entry [n/2] of the upper LUT, between entry [1] of the lower LUT and entry [n/2+1] of the upper LUT, and so forth. In some embodiments, the difference entries are determined using any function that allows a data entry in the lower or upper half to be determined using only the value of the corresponding difference entry and the corresponding data entry in the opposite LUT (e.g., a reversible function). For example, in some embodiments, the entries in the difference LUT 310 are generated using an exclusive-or (XOR) function of corresponding entries of the lower and upper LUTs. As such, the value of a particular data entry of the lower half can be determined using the corresponding upper half data entry and XOR value, without needing to access the lower LUT. In other implementations, reversible functions other than XOR can be used to calculate the difference entries.

An access circuit 315 maps the read ports of the lower LUT 305A, the upper LUT 305B, and the difference LUT 310 to the read ports 320A and 320B (which are referred to as the "lower" and "upper" read ports, respectively). The read ports 320A and 320B are configured to receive read requests specifying read addresses of one or more entries in the two-port hLUT 300. The access circuit 315 includes, for each of the read ports 320, a multiplexer (MUX) 325 and a difference calculation circuit 330. Each difference calculation circuit 330 is configured to receive a data entry from the difference LUT 310 and a corresponding data entry from either the lower LUT 305A or the upper LUT 305B to calculate the value of a corresponding data entry in the upper LUT 305B or the lower LUT 305B, respectively (e.g., by implementing the reversible function that was used to generate the difference entry). For example, any entry in the upper LUT 305B (e.g., entry [n/2]) is determined by applying the XOR function to a corresponding entry in the lower LUT 305A and a corresponding entry in the difference LUT 310 (e.g., entry [0] and entry([0] XOR [n/2])). As such, a particular read port provides data corresponding to entries of the upper LUT 305B even if the upper LUT 305B is unavailable (e.g., due to being accessed by the other read port), by combining data retrieved from the lower LUT 305A and the difference LUT 310. Similarly, data entries of the lower LUT 305A are determined by accessing the upper LUT 305B and the difference LUT 310 when the lower LUT 305A is unavailable.

The access circuit 315 includes a first difference circuit 330A configured to determine entries in the upper LUT 305B using corresponding entries from the lower LUT 305A and the difference LUT 310, and a second difference circuit 330B configured to determine entry values in the lower LUT 305A using corresponding entries from the upper LUT 305A and the difference LUT 310. The first and second difference circuits 330A/B are referred to as the lower and upper difference circuits, respectively.

The MUXs 325 include a lower MUX 325A and an upper MUX 325B. The two MUXs are configured to select between the lower LUT 305A, the upper LUT 305A, and the output of one of the difference circuits 330A or 330B, and provide the selected output to a respective read port 320A/B. For example, the lower read port 320A receives an output of the lower MUX 325A, which is connected to the difference circuit 330A, while the upper read port 320B receives an output of the upper MUX 325B, which is connected to the difference circuit 330B.

In some embodiments, a conflict control circuit 335 can use a priority scheme to determine which read ports can access the data entries stored in the LUTs 305A, 305B, and 310. The conflict control circuit 335 is configured to receive read addresses from the read ports and perform conflict resolution between any concurrently received requests by controlling the MUXs 325A/B to select the LUT from which each read port 320A/B should receive data.

In an example priority scheme, the lower read port 320A has "priority" to the lower LUT 305A. As such, the conflict control circuit 335 configures the MUX 325A such that all requests through the lower read port 320A for entries in the lower LUT 305A are read directly from the lower LUT 305A. Similarly, the upper read port 320B has "priority" to the upper LUT 305B, such that all requests through the upper read port 320B for entries in the upper LUT 305B are read directly from the upper LUT 305B. In addition, the conflict control circuit 335 configures the MUXs 325A/B such that each read port 320A/B may read directly from lower/upper LUT 305A/B to which it does not have priority whenever the other read port has not received a concurrent read request to read data from the same LUT. However, if both the lower read port 320A and the upper read port 320B receive concurrent requests to read one or more entries from the upper LUT 305B, then the conflict control circuit 335 configures the MUX 325A such that the lower read port 320A reads from the output of the difference calculation circuit 330A instead. The difference calculation circuit 330A determines the values of the requested entries of the upper LUT 305B using the corresponding entries of the lower LUT 305A and the difference LUT 310. Similarly, if the lower and upper read ports 320A and 320B receive concurrent requests to read one or more entries from the lower LUT 305A, the conflict control circuit 335 configures the MUX 325B to cause the upper read port 320B to read from the output of the difference calculation circuit 330B.

hLUTs that use the same principle of operation as the two-port hLUT 300 but have additional read ports are possible. For example, an hLUT with four read ports can be implemented with nine one-port LUTs. In some cases, the hLUTs described herein have about two ports, three ports, four ports, eight ports, 16 ports, 32 ports, or more, to implement two-way, three-way, four-way, eight-way, 16-way, or 32-way SIMD logic, respectively.

The two-port hLUT 300 provided in reference to FIG. 3 facilitates the execution of SIMD applications by providing read access to two consumer components per clock cycle. Advantageously, the two-port hLUT 300 requires only 50% more memory than a one-port LUT, while conventional two-port hLUTs require twice as much memory (see, e.g., FIG. 2). Updating the configurations stored in the two-port hLUT 300, however, may require sending 50% more data to the hLUT (e.g., data entries [0] to [n/2−1], [n/2] to [n−1], and corresponding difference entries), which can be time and energy-intensive. The circuit 105 addresses this issue. In particular, the registers 110 send only data entries [0] to [n/2−1] and [n/2] to [n−1] but not the difference entries. Instead, the transformation units 115, which can be in close physical proximity to the hLUTs 120, compute the difference entries, e.g., using a circuit configured to implement an XOR function. In some cases, the registers 110 propagate only data entries [0] to [n/2−1]. In such cases, the transformation units 115 can compute new difference entries by using the propagated data entries [0] to [n/2−1] and data entries [n/2] to [n−1] from the upper LUT 305B.

Figure 4:
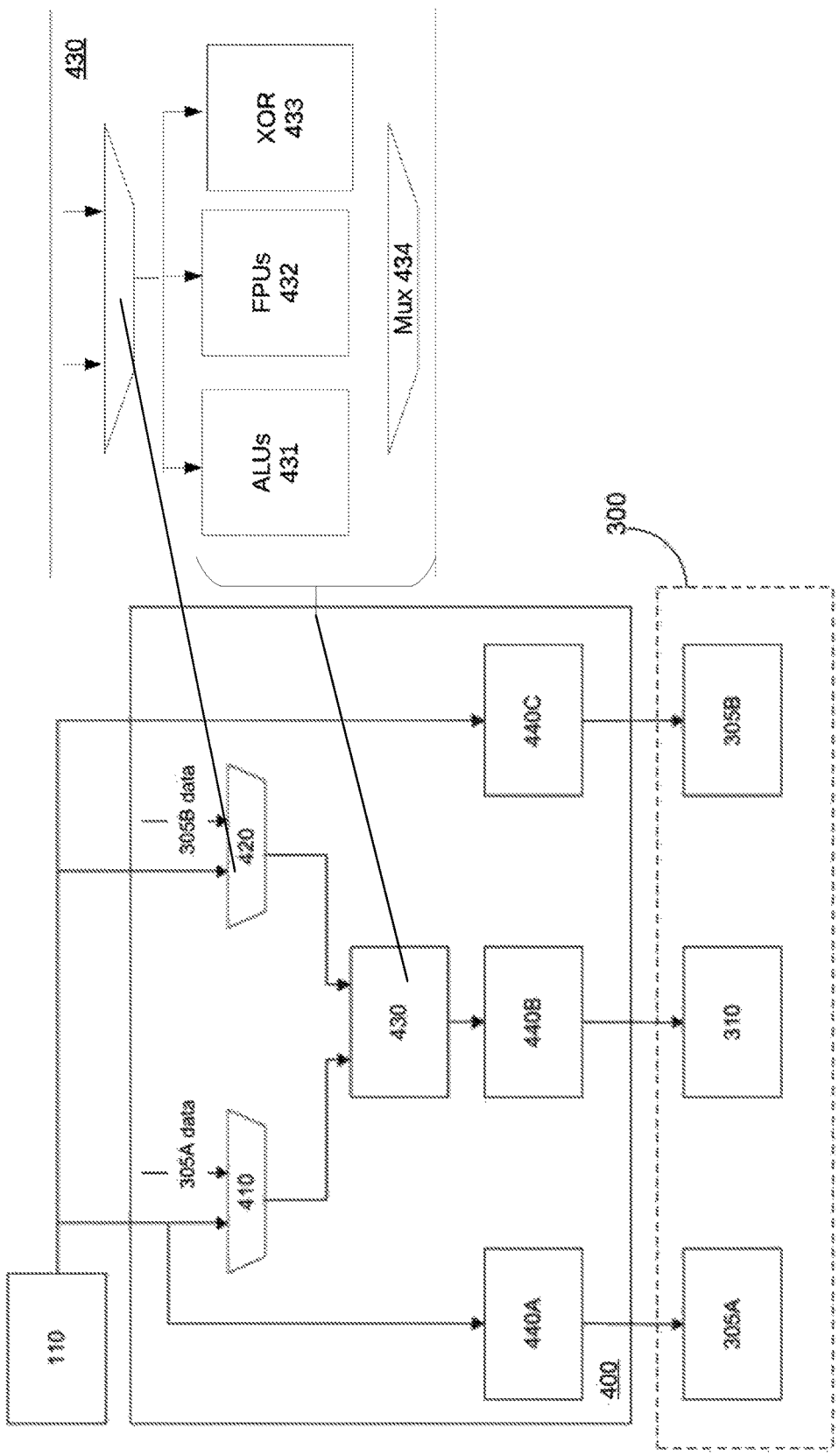
FIG. 4 schematically illustrates a transformation unit.

FIG. 4 illustrates a transformation unit 400 that performs the functions described above, in accordance with an embodiment of the present disclosure. The transformation unit 400 provides configuration data to the two-port hLUT 300, which includes the lower (one-port) LUT 305A, difference LUT 310, and upper LUT 305B. The transformation unit 400 includes a lower multiplexer 410. The lower multiplexer 410 is configured to select between data entries [0] to [n/2−1] (the first half of a set of data entries) from the register 110 or from corresponding data that is already stored in the lower LUT 305A. The lower multiplexer 410 selects the data that is already stored in the lower LUT 305A when the data in the lower LUT 305A does not need to be updated and was not propagated through the register 110. An upper multiplexer 420 performs analogous functions for the upper LUT 305B. The upper multiplexer 420 is configured to select between data entries [n/2] to [n−1] (the second half of the set of data entries) from the register 110 or from corresponding data that is already stored in the upper LUT 305B. The upper multiplexer 420 selects the data that is already stored in the upper LUT 305B when the data in the upper LUT 305B does not need to be updated and was not propagated through the register 110.

A data generation circuit 430 generates difference data using data from the register 110, or data from the register 110 and data from the upper or lower LUTs 305A and 305B. The difference data generation circuitry can be configured to implement an XOR function or another reversible function as described above.

Alternatively, data generation circuit 430 receives raw data representing a portion of possible input values for an operation and computes hLUT configurations by performing selected operations on the raw data. Pre-computed results, by way of example, may be a sine function and data generation circuit 430 calculates a range of values between 0 and $2\pi$ that are then written to the hLUT. It will be appreciated that data generation circuit 430 is configurable to implement any transfer function. Configuring may occur during the design process In this embodiment, multiplexers 410 and 420 are configured to receive data from registers 110 or other sources and route the raw data to a selected computing resource provided by data generation circuit 430. Such resources may include ALUs 431, FPUs 432 or XOR 433 or a similar circuit that is capable of implementing mathematic functions, logic functions, cryptographic functions, or the like. These computing resources perform calculations transforming data into configuration data.

In some embodiments, data generation circuit 430 is configured during the design process, that is, EDA tools commercially available from Synopsys, Inc. or Cadence Design Systems, Inc. configure data generation circuit 430 pre-silicon. In one embodiment, multiplexers 410 and 420 may transfer register data to a single resource such as XOR 433 which is a difference generation circuit that generates difference configuration data. In other embodiments, data generation circuit 430 has multiple resources connected to the outputs of multiplexors 410 and 420 capable of computing configuration data that may vary based on the particular application executing on processor 100.

In one embodiment, data generation circuit 430 comprises a dedicated block of computing resources 431-433 that may be selectively invoked. By way of example, computing resource 431 may comprise a single ALU. In other embodiments, computing resource 431 may comprise four, eight or more ALUs. In other embodiments, computing resource 432 may comprise four, eight or more FPUs. In both of these embodiments, the outputs of computing resources 431 and 432 are coupled to XOR 434 to enable efficient storage in the hLUT. In general, computing resources 431-433 include sufficient ALUs, FPUs or other circuits to implement reversible functions to meet the needs of a wide range of applications and the actual number is merely a design choice. Computing resources 431-433, 434 and multiplexer 435 are located in close proximity to the hLUT on the integrated circuit to minimize the wire lengths between computing resources 431-433, 434 and multiplexer 435 and the hLUT memory. To minimize power, computing resources 431-433 operate at a lower frequency compared to other computing resources on the TSP, it being understood that when operating at lower frequency, operations generally use less power but take longer to complete the computing process. In other embodiments, computing resources 431-433 may operate at a higher frequency if engineering considerations require. In such embodiment, power savings are achieved by the close proximity between computing resources 431-433 and the hLUT since line buffers, common on long wires may be omitted due to the proximity. Although this embodiment shows the resources 431-433 being communicatively coupled with the multiplexer 420, there is a corresponding set of resources also connected to the multiplexer 410. Thus, the resources are associated with both the upper and lower halves of the memory.

Additional power savings are achieved by a clock gating system (not shown) that enables selected computing resources 431-434 to be placed in a low power state once the hLUT is fully populated. When hLUT needs to be updated, the computing resources 432-435 are switched to an active state to transform register data to hLUT configurations.

The transformation unit 400 also has write circuitry 440A to 440C. The write circuitry 440A is configured to write data (e.g., entries [0] to [n/2−1]) from the register 110 to the lower LUT 305A, the write circuitry 440C is configured to write data (e.g., entries [n/2] to [n−1]) from the register 110 to the upper LUT 305B, and the write circuitry 440B is configured to write data from the difference data generation circuit 430 to the difference LUT 310. The write circuitry includes data busses to transmit the data and address lines to write the proper memory cells in the LUTs.

FIG. 4 depicts just one implementation of a transformation unit. In certain other implementations, the transformation unit 115 is configured to perform functions other than generating difference data. For example, the transformation units 115 is configured to implement an identity or negation transformation, compression or decompression (e.g., run-length encoding or decoding), encryption, or the like.

Figure 5:
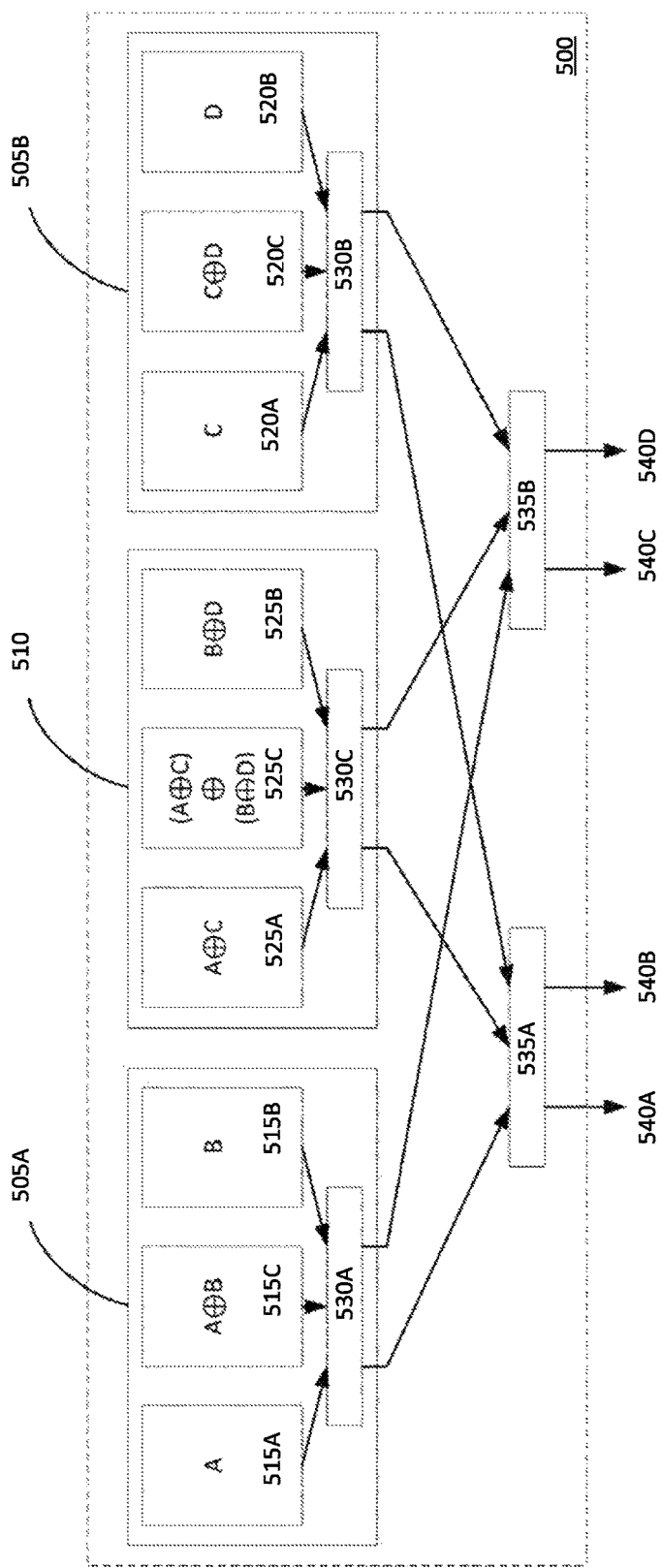
FIG. 5 schematically illustrates a 4-port hLUT.

FIG. 5 schematically illustrates a 4-port hLUT 500, in one embodiment. The 4-port hLUT of FIG. 5 is assembled using three different 2-port hLUTs (e.g., the hLUT 300 of FIG. 3), including a lower 2-port hLUT 505A, an upper 2-port hLUT 505B, and a difference 2-port hLUT 510. In the embodiment of FIG. 5, as in the embodiment of FIG. 3, the difference 2-port hLUT implements an XOR function.

2-port hLUTs 505A, 505B, and 510 also comprise respective sub-access circuits 530 (e.g., sub-access circuits 530A-C, analogous to access circuit 315). The sub-access circuits 530A-C all connect to access circuits 535A-B. As with the sub-access circuits 530A-C, the access circuits 535A-B may have substantially similar structures to access circuit 315. This provides the 4-port hLUT the ability to have four read ports, each able to access any of data subsets A, B, C, and D.

Figure 6:
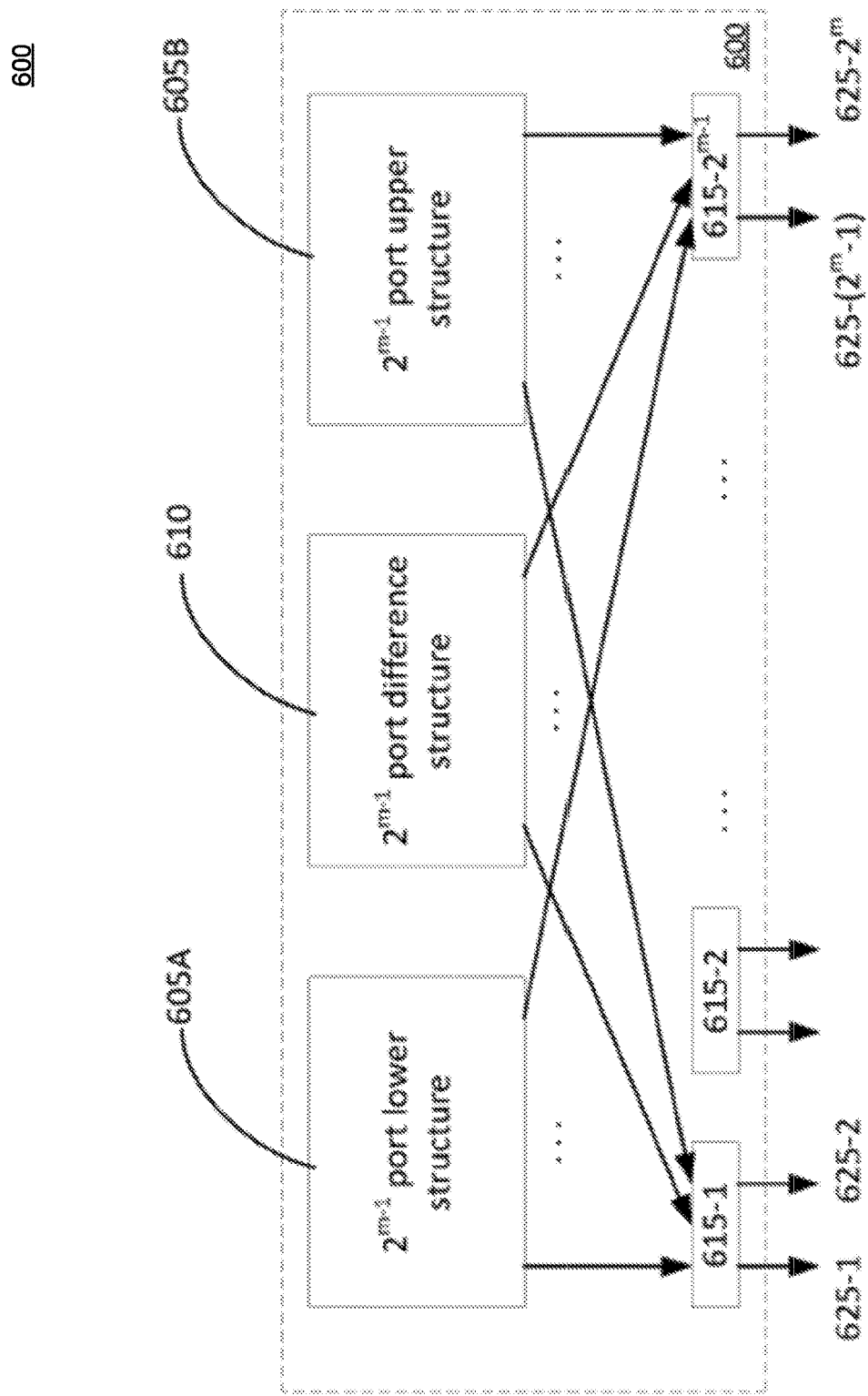
FIG. 6 schematically illustrates a generalized hLUT having $2^m$ read ports.

FIG. 6 schematically illustrates a generalized hLUT 600 having $2^m$ read ports constructed from $2^{m-1}$-port hLUTs, comprising a lower hLUT 605A, an upper hLUT 605B, and a difference hLUT 610. The $2^{m-1}$-port hLUTs provide access to n/2 data entries. Each of the ports of the hLUTs maps to access circuit 615 (e.g., access circuits 615-1 through 615-$2^{m-1}$). For example, a first port of each of the three $2^{m-1}$ hLUTs maps to first access circuit 615-1. An access circuit 615 includes two read ports 625 to access the lower and upper hLUTs 605 A/B directly or determine the values of data entries of the lower or upper hLUT using the difference hLUT 610 and the opposite hLUT (e.g., for the lower hLUT, the difference hLUT and the upper hLUT).

Thus, as in the embodiment illustrated in FIG. 6, the $2^m$-port hLUT has $2^{m-1}$ access circuits mapped to the $2^{m-1}$-port hLUTs. An access circuit 615 includes two ports, so a total of $2^m$ ports are available. This enables the $2^m$-port hLUT to be constructed using $(3/2)^m*n$ entries. Thus, there is a greater reduction in the number of entries needed as the number of ports in the hLUT increases. For example, a 2-port hLUT requires one and a half times as many entries as a 1-port LUT, whereas implementing a 2-port LUT from two 1-port LUTs would require twice the number of entries as a single 1-port LUT. But a 4-port hLUT would require 2.25 times as many entries, versus 4 times for four 1-port LUTs. For a 16-port hLUT, this advantage increases to 5 times versus 16 times for 1-port LUTs. This relative cost is thus $(3/4)^m$ when comparing implementing hLUTs versus an equivalent number of single-port LUTs.

Transmission efficiencies are achieved by minimizing transmitting requested results from the hLUT by sending only a portion of the results and then recreating the unsent data using forward error correction (FEC) techniques. By way of illustration, when an algorithm is being calculated by a processor based system and power minimization is a goal, a partial set of results may be sent from hLUT to the destination (result) register of the processor. The processor would then invoke a low power FEC algorithm (not shown) to recreate the missing data.

Figure 7:
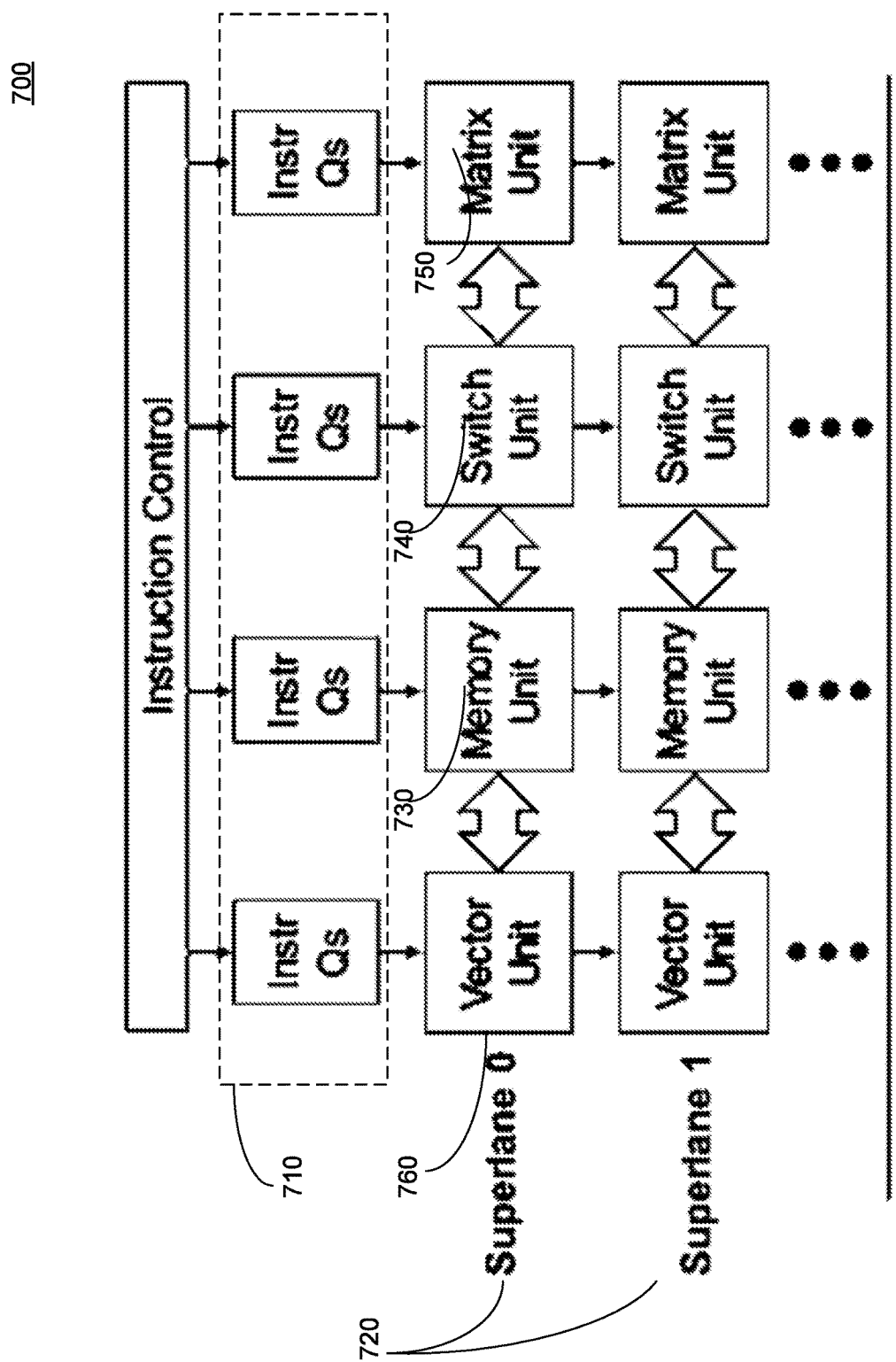
FIG. 7 illustrates a conceptual architecture embodiment 700 of a tensor streaming processor (TSP).

FIG. 7 illustrates a conceptual architecture embodiment 700 of a tensor streaming processor (TSP), a large processor with hundreds of function units for efficiently performing machine learning computations. Such a processor can perform up to 1,000 trillion operations per second. Additionally, the processor can handle floating-point data, enabling it to perform both inference and training. The embodiment 700 is configured to perform SIMD operations on data in multiple Superlanes 720.

The TSP enables instructions 710 to execute at different times in different Superlanes 720. The configuration of conceptual architecture 700 reduces clock skew, making it easier for the processor to synchronize operations. Within each Superlane 720, data flows horizontally through the functional units 760, 730, 740, and 750, while instructions 710 flow vertically. On a first clock cycle, the first group of instructions 710 executes in Superlane 0. On the next clock cycle, the first group of instructions 710 executes in Superlane 1, while a second group of instructions (not pictured) executes in Superlane 0. The TSP chip may feature 20 such Superlanes, each with 16 functional units (e.g. a vector unit 760, a memory unit 730, a switch unit 740, or a matrix unit 750). Continually pushing data across the chip on every clock cycle simplifies routing and enables a natural flow of data during neural network calculations. Thus, during 20 clock cycles, each instruction executes on all 320 lanes across all of the Superlanes 720, creating a 320-byte SIMD operation with a 20-cycle pipeline. The conceptual architecture 700 is fully deterministic, enabling programmers to calculate throughput before executing applications on the chip.

The TSP, as a machine learning processor, includes a vector unit 760 for performing operations on vectors. The vector unit 760 performs arithmetic and logical operations using a set of arithmetic logic units (ALUs). In the embodiment of FIG. 7, the vector unit 760 has 16 ALUs. Replacing the vector processor with a set of hLUTs would enhance processing speed, as results could be accessed from the hLUTs instead of repeatedly calculated. The architectures of the hLUTs themselves would enable 16 reads to be performed from the 16-port hLUTs, replacing the outputs from the 16 ALUs from the vector unit 760. Advantageously, the ability to perform a single read from hLUT, rather than perform a calculation on an ALU in the vector unit provides significant increase in operational efficiency and results in lower power consumption. It is to be understood, that although the hLUT examples herein are for 2-, 4- 8- or 16-port hLUT structures, it is feasible to provide much larger memory structures. For example, 32-port hLUTs or 64-port hLUTs can be used to further drive efficiency improvements when an application requires a high number of repetitive calculations.

The matrix units 750 provide substantial computation functions. A matrix unit 750 contains 320 multiply-accumulate (MAC) units per lane that are grouped into 20 16×16 supercells. A MAC unit has two 8-bit weight registers and two 32-bit accumulators. During a cycle, the matrix unit 750 multiplies the stored weight values by a pair of activation values from the streaming data. A 16×16 supercell computes an integer partial sum in one cycle and a complete 320-element fused dot-product in 20 cycles. Each hemisphere has 320×320 MAC units producing 409,600 INT8 operations or 102,400 FP16 operations per cycle. Using all 32 streams in each direction, the TSP can load all 409,600 weight registers in less than 40 cycles.

The switch units 740 reshape tensor data to enable compute units (e.g., the vector unit 720 and matrix unit 750) to perform computations on the data. For example, a switch unit 740 can rotate or transpose a stream of data across the lanes. The switch unit 740 can duplicate bytes to fill a vector or zero any of the vector elements to pad values. The switch units 740 also communicate between Superlanes. Every unit has two sets of lane shifters that can move data up or down (north/south) to adjacent Superlanes.

The memory unit 730 contains 5.5 MB of SRAM divided into 44 slices (banks) of 128 KB apiece. The memory unit 730 can perform two 16-byte reads and two 16-byte writes per cycle (in different memory banks), allowing it to both source and sink data across all lanes in a Superlane. Combining the 20 Superlanes 720 produces 110 MB of SRAM per hemisphere.

Figure 8:
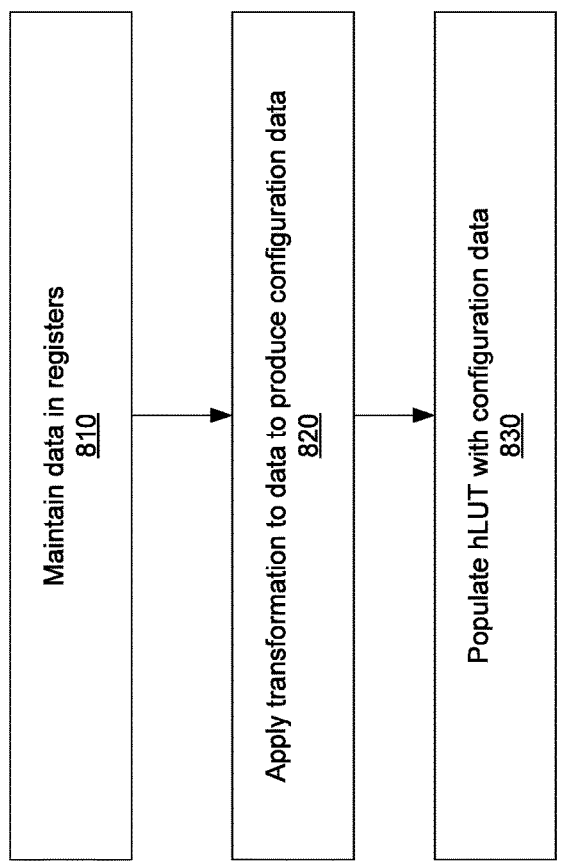
FIG. 8 illustrates a flow chart for implementing a method to update a configuration of a lookup table.

FIG. 8 illustrates a flow chart for implementing a method to update a configuration of a lookup table.

In a first operation 810, the system maintains data in registers 110. The configuration data may be raw data, or partial, incomplete, or compressed hLUT configurations. The registers may propagate the data in a single clock cycle or over multiple clock cycles.

In a second operation 820, the system provides the configuration data to a transformation circuit, e.g., the transformation unit 400. The transformation units 115 select the data to transform using multiplexers. Then, the transformation circuit performs one or more operations on the data. The transformation circuit may perform calculations on the data, interpolate missing data values, or decompress the data, in order to produce configuration data for the hLUTs. In some embodiments, the transformation units 115 calculate difference data for a difference LUT or hLUT. In some embodiments, a transformation unit (e.g., the transformation unit 400) uses a difference data generation unit (e.g., difference data generation unit 430) to perform an XOR operation on values for an upper LUT (if the hLUT has two ports) or hLUT (if there are more than two ports) and lower LUT/hLUT, in order to configure a difference LUT/hLUT.

In a third operation 830, the system provides the configuration data to the hLUT (e.g., the hLUT 300). The transformation circuit (e.g., 400) uses write circuitry (e.g., one of blocks 440A-C) to configure the hLUT. For example, the transformation circuit of FIG. 4 configures the upper LUT with upper LUT data, the lower LUT with lower LUT data, and the difference LUT with difference data calculated by difference data generation unit 430.

FIG. 9 schematically illustrates partial configuration data 900 to be provided to an hLUT, in accordance with an embodiment. The partial configuration data is for an hLUT providing lookup values for an increment operation. For an input 8-bit address, the table provides an output result that is the 8-bit address incremented by 1. The addresses range from 0 to 255, with incrementing 255 resulting in 0. The missing values are to be imputed by the circuit's transformation unit (e.g., the transformation unit 400). In some embodiments, the transformation unit itself performs an increment operation using an ALU in order to fill in the missing values in the partial configuration data 900.

FIG. 10 schematically illustrates a complete configuration 1000, in accordance with an embodiment. The configuration 1000 is the partial configuration 900 with missing values imputed by the transformation unit. With the complete configuration 1000, the hLUT may provide an output 8-bit address for any 8-bit input address.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

Computer Systems

Figure 11:
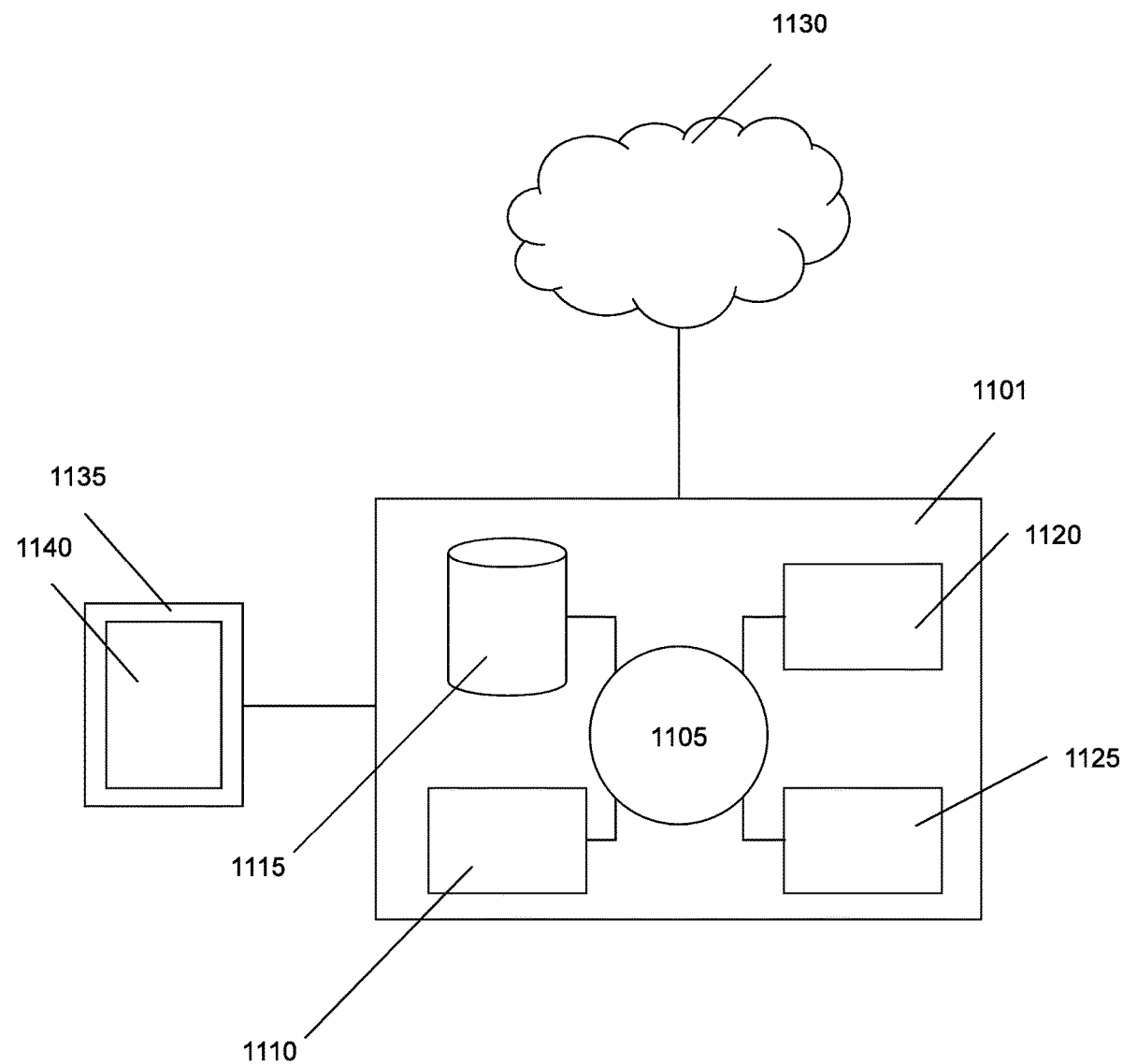
FIG. 11 shows a computer system that is programmed or otherwise configured to implement methods and systems provided herein.

The present disclosure provides computer systems that are programmed to implement methods and systems of the disclosure. FIG. 11 shows a computer system 1101 in which the circuit of the present disclosure can be implemented. The computer system 1101 can read from the LUTs in the circuit of the present disclosure to perform SIMD applications. The computer system 1101 can be an electronic device of a user or a computer system that is remotely located with respect to the electronic device. The electronic device can be a mobile electronic device.

The computer system 1101 includes a central processing unit (CPU, also "processor" and "computer processor" herein) 1105, which can be a single core or multi core processor, or a plurality of processors for parallel processing. The computer system 1101 also includes memory or memory location 1110 (e.g., random-access memory, read-only memory, flash memory), electronic storage unit 1115 (e.g., hard disk), communication interface 1120 (e.g., network adapter) for communicating with one or more other systems, and peripheral devices 1125, such as cache, other memory, data storage and/or electronic display adapters. The memory 1110, storage unit 1115, interface 1120 and peripheral devices 1125 are in communication with the CPU 1105 through a communication bus (solid lines), such as a motherboard. The storage unit 1115 can be a data storage unit (or data repository) for storing data. The computer system 1101 can be operatively coupled to a computer network ("network") 1130 with the aid of the communication interface 1120. The network 1130 can be the Internet, an internet and/or extranet, or an intranet and/or extranet that is in communication with the Internet. The network 1130 in some cases is a telecommunication and/or data network. The network 1130 can include one or more computer servers, which can enable distributed computing, such as cloud computing. The network 1130, in some cases with the aid of the computer system 1101, can implement a peer-to-peer network, which may enable devices coupled to the computer system 1101 to behave as a client or a server.

The CPU 1105 can execute a sequence of machine-readable instructions, which can be embodied in a program or software. The instructions may be stored in a memory location, such as the memory 1110. The instructions can be directed to the CPU 1105, which can subsequently program or otherwise configure the CPU 1105 to implement methods of the present disclosure. Examples of operations performed by the CPU 1105 can include fetch, decode, execute, and writeback.

The CPU 1105 can be part of a circuit, such as an integrated circuit. One or more other components of the system 1101 can be included in the circuit. In some cases, the circuit is an application specific integrated circuit (ASIC).

The storage unit 1115 can store files, such as drivers, libraries and saved programs. The storage unit 1115 can store user data, e.g., user preferences and user programs. The computer system 1101 in some cases can include one or more additional data storage units that are external to the computer system 1101, such as located on a remote server that is in communication with the computer system 1101 through an intranet or the Internet.

The computer system 1101 can communicate with one or more remote computer systems through the network 1130. For instance, the computer system 1101 can communicate with a remote computer system of a user. Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 1101 via the network 1130.

Methods as described herein can be implemented by way of machine (e.g., computer processor) executable code stored on an electronic storage location of the computer system 1101, such as, for example, on the memory 1110 or electronic storage unit 1115. The machine executable or machine readable code can be provided in the form of software. During use, the code can be executed by the processor 1105. In some cases, the code can be retrieved from the storage unit 1115 and stored on the memory 1110 for ready access by the processor 1105. In some situations, the electronic storage unit 1115 can be precluded, and machine-executable instructions are stored on memory 1110.

Advantageously, the circuit and methods as described herein are very useful in other applications. For example, FPGA devices, RISC or CISC processors or emulation systems (either FPGA or processor based) having the circuits described herein will efficiently off-load repetitive calculations and store such results as configurations in hLUTs.

The code can be pre-compiled and configured for use with a machine having a processer adapted to execute the code or can be compiled during runtime. The code can be supplied in a programming language that can be selected to enable the code to execute in a pre-compiled or as-compiled fashion.

Aspects of the systems and methods provided herein, such as the computer system 1101, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 1101 can include or be in communication with an electronic display 1135 that comprises a user interface (UI) 1140. Examples of UI's include, without limitation, a graphical user interface (GUI) and web-based user interface.

Methods and systems of the present disclosure can be implemented by way of one or more algorithms. An algorithm can be implemented by way of software upon execution by the central processing unit 1105. The algorithm can, for example, a machine learning algorithm or SIMD application.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and LUTs within the scope of these claims and their equivalents be covered thereby.

What is claimed is:

1. A circuit for configuring a plurality of HyperLUTs (hLUTs) comprising:
    a plurality of registers configured to propagate a set of data or a portion thereof to the plurality of HyperLUTs (hLUTs);
    for a hLUT of the plurality of hLUTs, a transformation unit comprising:
    transformation circuitry configured to (i) receive the set of data or the portion thereof from a register of the plurality of registers, (ii) transform the set of data or the portion thereof into configurations for the hLUT and (iii) writing the configurations in the hLUT for access upon a query of the hLUT; and
    an artificial intelligence processor configured to selectively access results stored in the hLUT.

2. The circuit of claim 1, wherein the hLUT comprises (i) a first memory sub-structure configured to store a first subset of data of the set of data, (ii) a second memory sub-structure configured to store a second subset of data of the set of data, and (iii) a third memory sub-structure configured to store difference data defining a difference between corresponding elements of the first subset of data and the second subset of data.

3. The circuit of claim 2, wherein the transformation circuitry comprises difference data generation circuitry configured to generate the difference data using at least the set of data or the portion thereof from the register.

4. The circuit of claim 3, further comprising write circuitry configured to write the configurations to the hLUT, wherein the write circuitry is configured to write (i) the set of data or the portion thereof from the register to the first memory sub-structure and/or the second memory sub-structure and (ii) the difference data from the difference data generation circuitry to the third memory sub-structure.

5. The circuit of claim 3, wherein the difference data generation circuitry comprises a circuit configured to implement a reversible function.

6. The circuit of claim 1, wherein the hLUT is configured to implement an n-way single instruction multiple data (SIMD) logic where n is an integer greater than one.

7. The circuit of claim 1, wherein the hLUT comprises n read ports, where n is an integer greater than one.

8. The circuit of claim 1, wherein the transformation circuitry is configured to transform the set of data or the portion thereof into the configurations at least in part by applying an identity transformation to the set of data or the portion thereof.

9. The circuit of claim 1, wherein the transformation circuitry is configured to implement an enable function that determines whether the set of data or the portion thereof is written to the hLUT.

10. The circuit of claim 1, wherein the transformation circuitry comprises an XOR gate configured to apply an XOR function to entries in a first subset of the set of data and corresponding entries in a second subset of the set of data.

11. The circuit of claim 1, wherein the set of data or the portion thereof comprises compressed configurations, and wherein the transformation circuitry is configured to transform the set of data or the portion thereof into the configurations at least in part by decompressing the compressed configurations.

12. The circuit of claim 1, wherein the configurations are pre-computed outputs of a function, and wherein the hLUT is configured to generate an output of the function for an input.

13. The circuit of claim 12, wherein the function is selected from the group consisting of a rectified linear unit function, a binary step function, an arc tan function, a maximum or minimum function, a square root function, an inverse square root function, a transfer function, addition, subtraction, multiplication, and division.

14. The circuit of claim 1, wherein the transformation circuitry comprises a multiplexer, and wherein the multiplexer is configured to receive a different set of data from each of multiple registers in the plurality of registers and select one or more of the different sets of data to write to the hLUT.

15. The circuit of claim 1, wherein the plurality of registers is configured to propagate the set of data or the portion thereof to successive hLUTs in the plurality of hLUTs on successive clock cycles.

16. The circuit of claim 1, wherein a quantity of the plurality of registers is less than a quantity of the plurality of hLUTs, and wherein two or more hLUTs of the plurality of hLUTs share a single register of the plurality of registers.

17. The circuit of claim 1, wherein the plurality of registers is configured to propagate the set of data or the portion thereof to a hLUT in the plurality of hLUTs over multiple clock cycles.

18. A method comprising:
receiving, from a register of a plurality of registers, a set of data or a portion thereof propagated by at least a subset of the plurality of registers;
transforming the set of data or the portion thereof into configurations for a HyperLUT (hLUT) of a plurality of hLUTs, including configuring the set of data or the portion thereof to fit into the hLUT;writing the configurations to the hLUT;
writing the configurations to the hLUT; and
selectively accessing results stored in the hLUT using an artificial intelligence processor.

19. The method of claim 18, wherein the configurations comprise more data than the set of data or the portion thereof.

20. The method of claim 18, wherein transforming the set of data or the portion thereof into configurations comprises applying a reversible function to the set of data or the portion thereof.

21. A circuit for configuring a plurality of HyperLUTs (hLUTs) comprising:
a plurality of hLUTs, wherein a hLUT of the plurality of hLUTs comprise an upper logic table, a lower logic table, and a difference logic table;
a plurality of registers configured to propagate a set of data or a portion thereof to the plurality of hLUTs, the set of data comprising one or more upper logic table values for the upper logic table and one or more lower logic table values for the lower logic table; and
a transformation unit connecting at least one of the plurality of registers to one of the plurality of hLUTs, the transformation unit comprising transformation circuitry configured to (i) receive the set of data or the portion thereof from a register of the plurality of registers,(ii) calculate one or more difference logic table values by performing one or more computations on the one or more upper logic table values and the one or more lower logic table values, and (iii) write the one or more upper table values into the upper logic table, the one or more lower table values into the lower logic table, and the one or more difference logic table values into the difference logic table, wherein the one or more upper logic table values, the one or more lower logic table values, and the one or more difference logic table values comprise a configuration providing an access to the one or more upper logic table values and the one or more lower table values upon a query of the hLUT.

22. A circuit for configuring a plurality of HyperLUTs (hLUTs) comprising:
a plurality of registers configured to propagate a set of data or a portion thereof to the plurality of hLUTs; and
for a hLUT of the plurality of hLUTs, a transformation unit comprising:
transformation circuitry configured to (i) receive the set of data or the portion thereof from a register of the plurality of registers, (ii) transform the set of data or the portion thereof into configurations for the hLUT and (iii) writing the configurations in the hLUT for access upon a query of the hLUT, wherein the transformation circuitry comprises difference data generation circuitry configured to generate difference data using at least the set of data or the portion thereof from the register, and the transformation circuitry is further configured to write the difference data in the hLUT.

* * * * *

UNITED STATES PATENT AND TRADEMARK OFFICE
CERTIFICATE OF CORRECTION

PATENT NO. : 11,165,428 B1
APPLICATION NO. : 16/932632
DATED : November 2, 2021
INVENTOR(S) : Ross et al.

Page 1 of 1

It is certified that error appears in the above-identified patent and that said Letters Patent is hereby corrected as shown below:

On the Title Page

Item [57], Line 3, after "include a plurality" insert -- of --.

In the Claims

Column 19, in Claim 12, Line 38, delete "pre- computed" and insert -- pre-computed --, therefor.

Column 20, in Claim 18, Line 8, delete "hLUT;writing" and insert -- hLUT; writing --, therefor.

Column 20, in Claim 21, Line 34, delete "registers,(ii)" and insert -- registers, (ii) --, therefor.

Signed and Sealed this
Fifth Day of April, 2022

Drew Hirshfeld
*Performing the Functions and Duties of the
Under Secretary of Commerce for Intellectual Property and
Director of the United States Patent and Trademark Office*